(12) United States Patent
Mauder et al.

(10) Patent No.: US 9,245,760 B2
(45) Date of Patent: Jan. 26, 2016

(54) METHODS OF FORMING EPITAXIAL LAYERS ON A POROUS SEMICONDUCTOR LAYER

(75) Inventors: Anton Mauder, Kolbermoor (DE); Hans-Joachim Schulze, Taufkirchen (DE); Hans-Joerg Timme, Ottobrunn (DE); Franz Hirler, Isen (DE); Francisco Javier Santos Rodriguez, Villach (AT)

(73) Assignee: Infineon Technologies AG, Neubiberg (DE)

(*) Notice: Subject to any disclaimer, the term of this patent is extended or adjusted under 35 U.S.C. 154(b) by 258 days.

(21) Appl. No.: 12/895,664

(22) Filed: Sep. 30, 2010

(65) Prior Publication Data

US 2012/0080686 A1    Apr. 5, 2012

(51) Int. Cl.
| | | |
|---|---|---|
| H01L 21/20 | (2006.01) | |
| H01L 21/306 | (2006.01) | |
| H01L 21/02 | (2006.01) | |
| H01L 21/78 | (2006.01) | |
| H01L 29/78 | (2006.01) | |

(52) U.S. Cl.
CPC .......... *H01L 21/306* (2013.01); *H01L 21/0237* (2013.01); *H01L 21/0245* (2013.01); *H01L 21/0262* (2013.01); *H01L 21/02381* (2013.01); *H01L 21/02513* (2013.01); *H01L 21/02521* (2013.01); *H01L 21/02532* (2013.01); *H01L 21/78* (2013.01); *H01L 29/7846* (2013.01); *H01L 29/7848* (2013.01)

(58) Field of Classification Search
CPC ................................................ H01L 21/02513
USPC ...................................... 438/478; 257/E21.09
See application file for complete search history.

(56) References Cited

U.S. PATENT DOCUMENTS

| | | | |
|---|---|---|---|
| 4,806,996 A | 2/1989 | Luryi | |
| 6,258,698 B1 | 7/2001 | Iwasaki et al. | |
| 6,579,359 B1* | 6/2003 | Mynbaeva et al. | 117/94 |
| 6,774,435 B1* | 8/2004 | Matsumoto et al. | 257/347 |
| 7,718,469 B2 | 5/2010 | Hasan | |
| 7,998,272 B2* | 8/2011 | Song | 117/81 |
| 2002/0153595 A1* | 10/2002 | Tayanaka | 257/655 |
| 2005/0280119 A1 | 12/2005 | Momoi et al. | |
| 2006/0113635 A1* | 6/2006 | Notsu et al. | 257/616 |
| 2007/0093036 A1 | 4/2007 | Cheng et al. | |
| 2007/0108513 A1 | 5/2007 | Rub et al. | |
| 2008/0042211 A1* | 2/2008 | Bhattacharyya et al. | 257/369 |
| 2009/0239337 A1* | 9/2009 | Ye et al. | 438/107 |
| 2010/0102353 A1 | 4/2010 | Park | |

OTHER PUBLICATIONS

Bell, T.E., et al., "Porous silicon as a sacrificial material," J. Micromech. Microeng. 6, pp. 361-369, UK.
Bisi, O., et al., "Porous silicon: a quantum sponge structure for silicon based optoelectronics," Elesevier, 126 pages.
(Continued)

*Primary Examiner* — Hsin-Yi Hsieh
(74) *Attorney, Agent, or Firm* — Slater & Matsil, L.L.P.

(57) ABSTRACT

In one embodiment, a method of forming a semiconductor device includes forming a first porous semiconductor layer over a top surface of a substrate. A first epitaxial layer is formed over the first porous semiconductor layer. A circuitry is formed within and over the first epitaxial layer. The circuitry is formed without completely oxidizing the first epitaxial layer.

14 Claims, 22 Drawing Sheets

(56) References Cited

OTHER PUBLICATIONS

Herrick, K., et al., "Direct Growth of III-V Devices on Silicon," Mater. Res. Soc. Symp. Proc., vol. 1068, 2008. Materials Research Society, 6 pages.

Mi, Z., et al., "III-V compound semiconductor nanostructures on silicon: Epitaxial growth, properties, and applications in light emitting diodes and lasers," Journal of Nanophotonics, vol. 3, Jan. 23, 2009, pp. 1-19.

Pal, S., et al., "Silicon—a new substrate for GaN growth," Bull. Mater. Sci., vol. 27, No. 6, Dec. 2004, pp. 501-504.

Sanken, "GaN Power Devices on Si Substrate," GaN Development Group Advanced Technology Development Division Engineering Headquarters, Jun. 14, 2009, 45 pages.

* cited by examiner

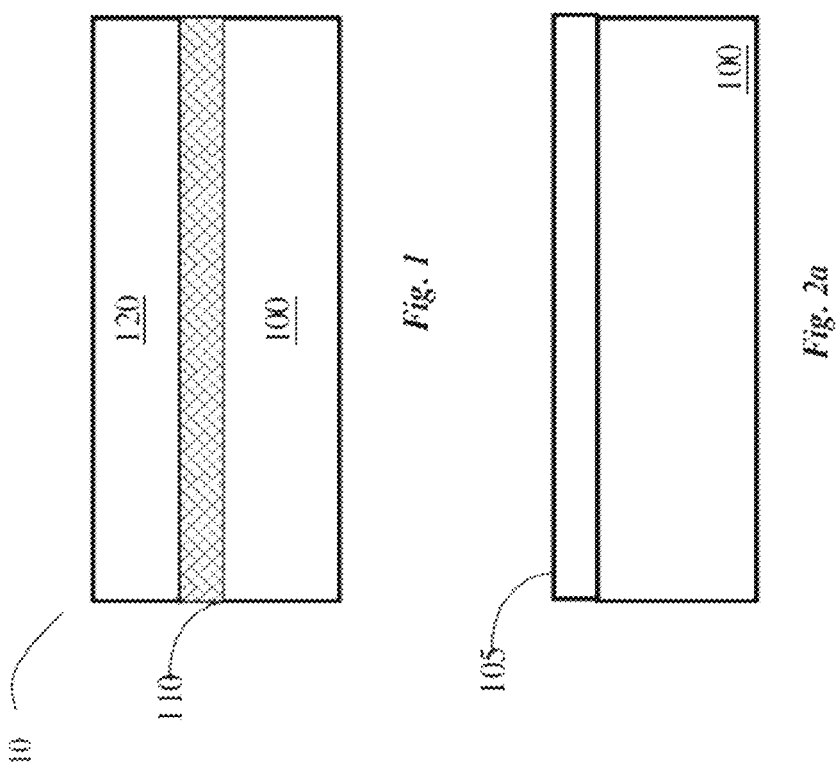

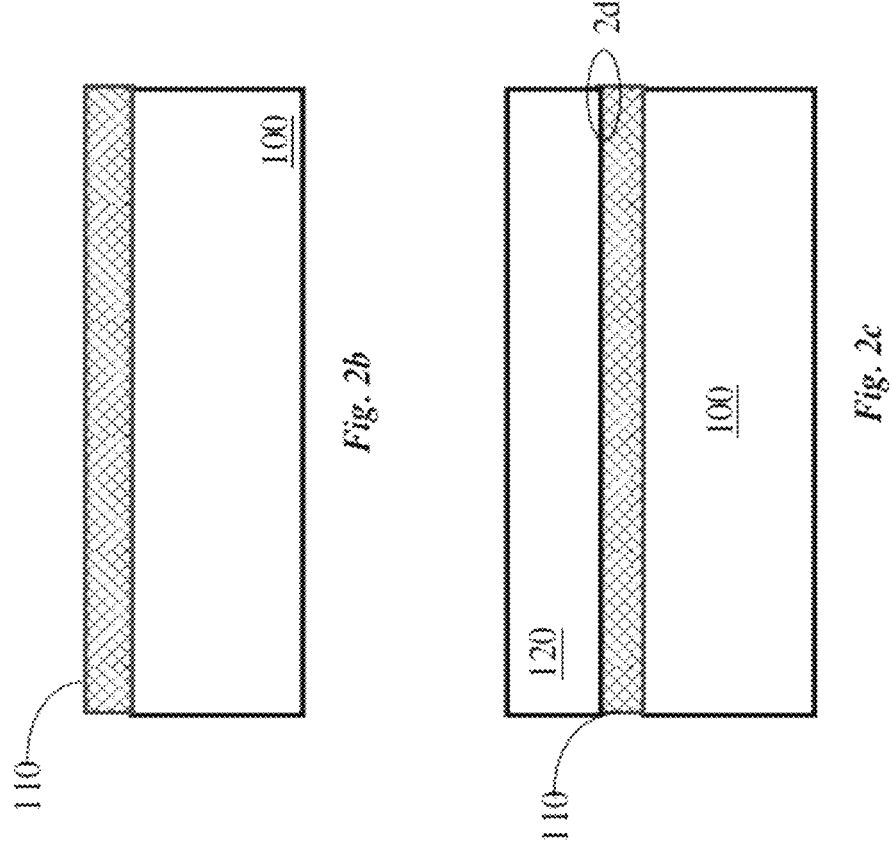

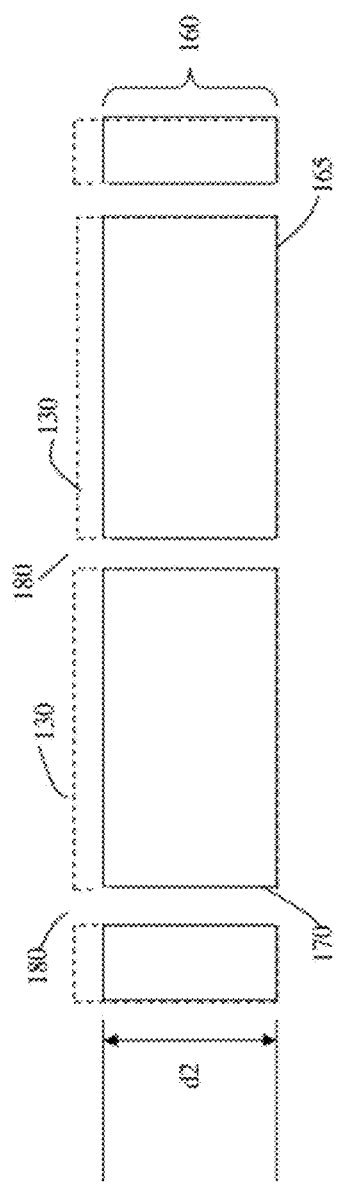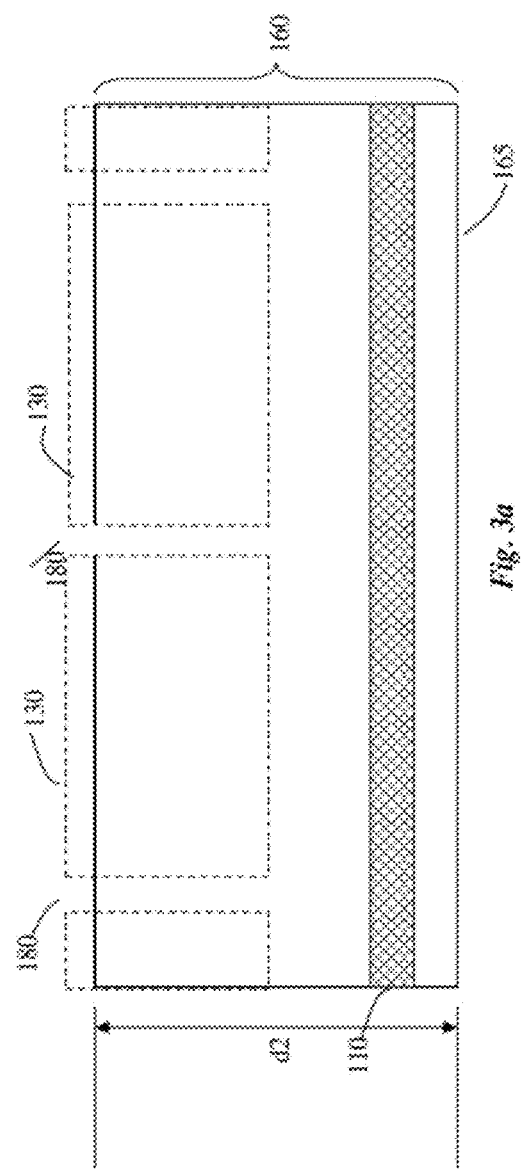

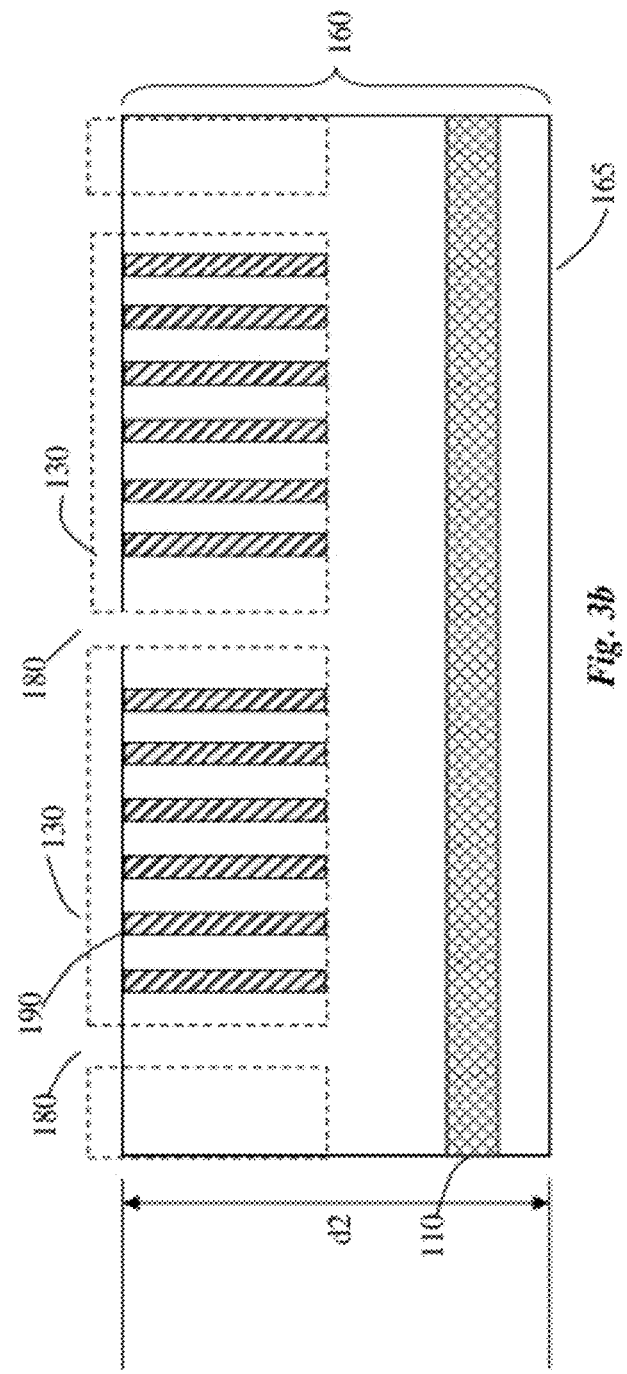

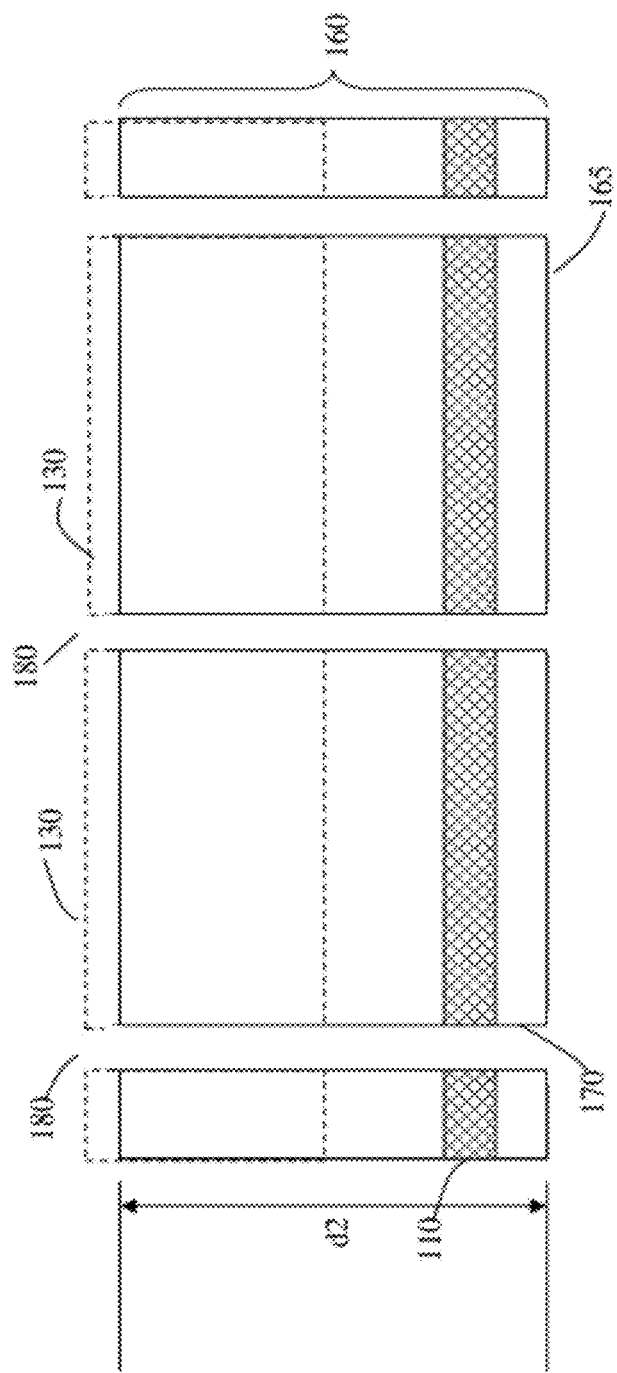

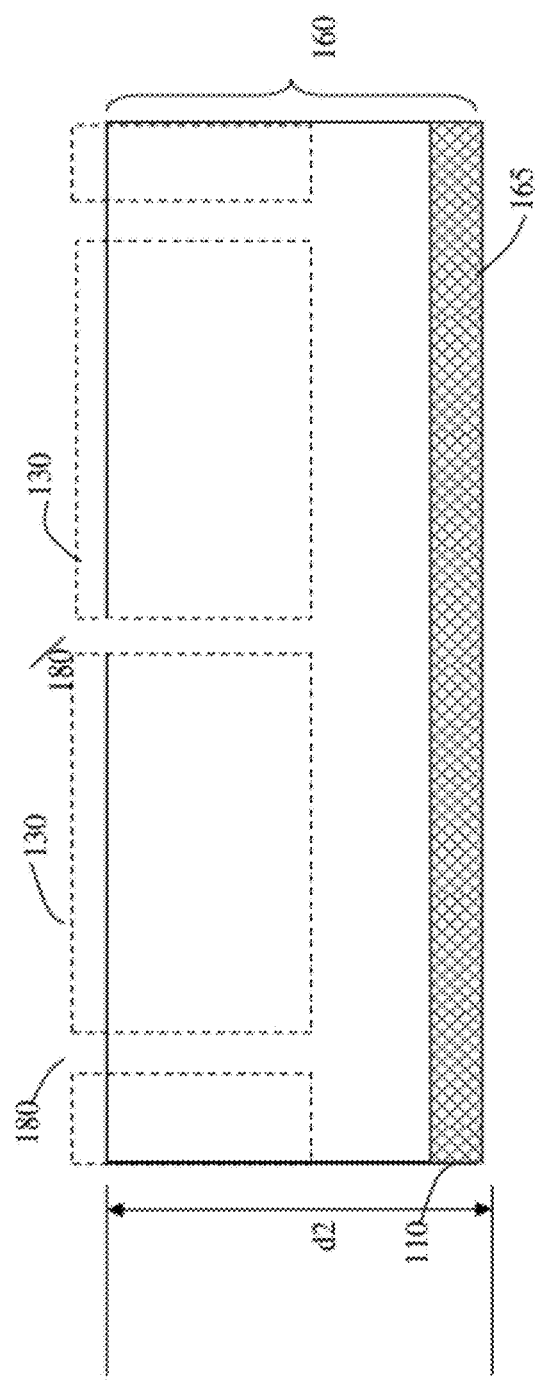

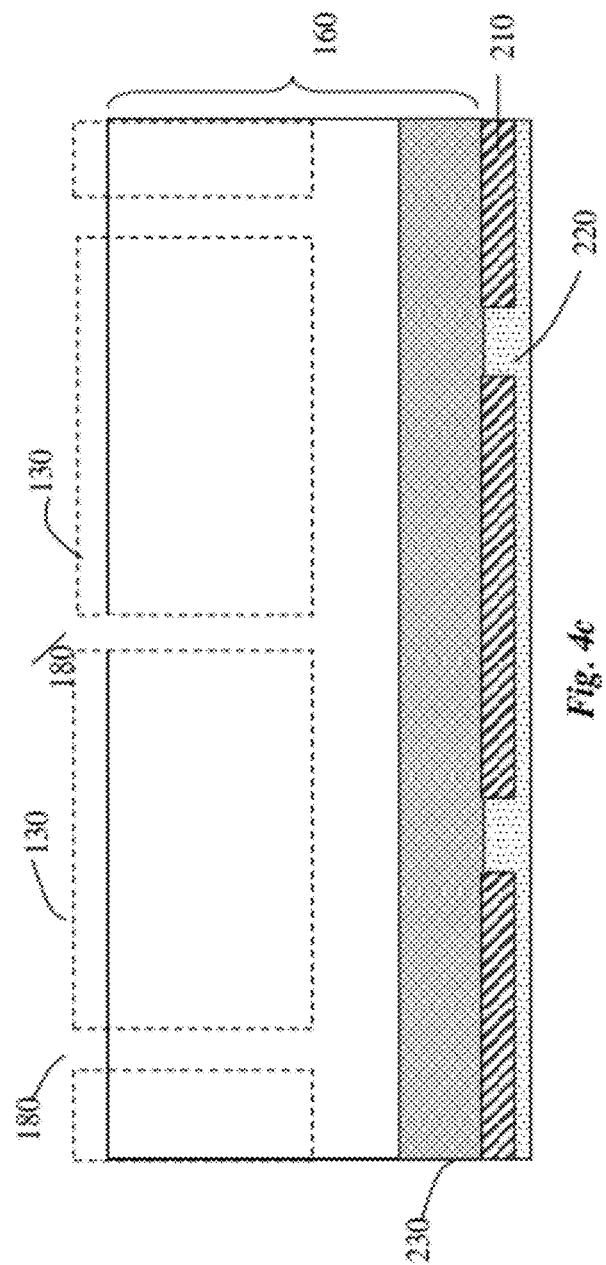

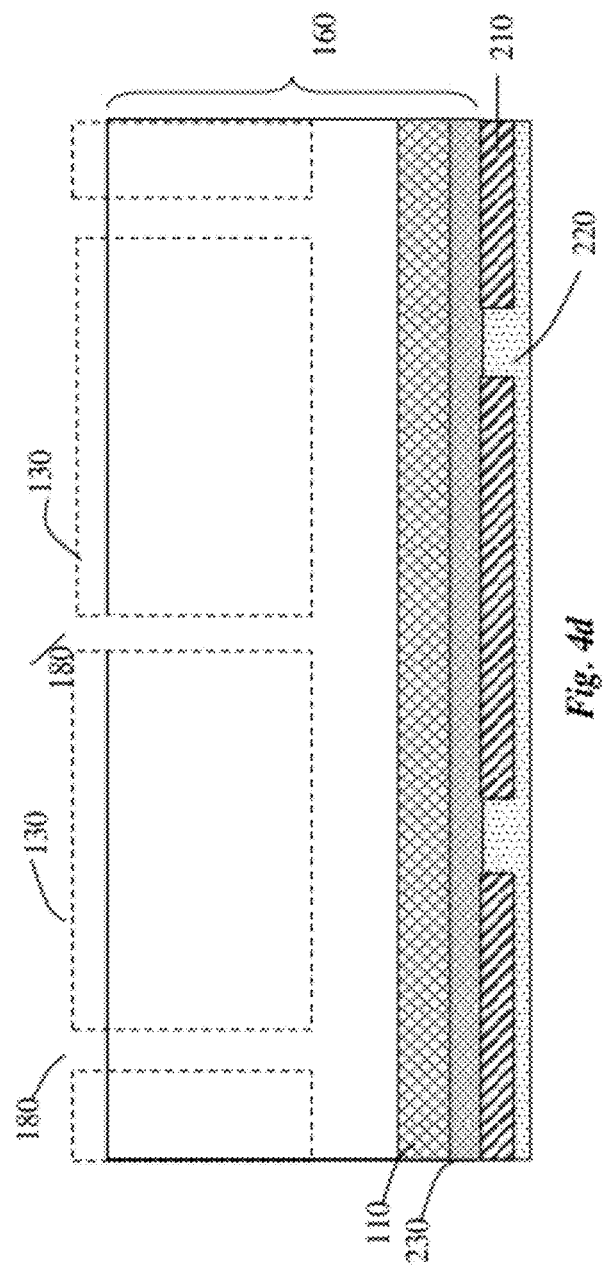

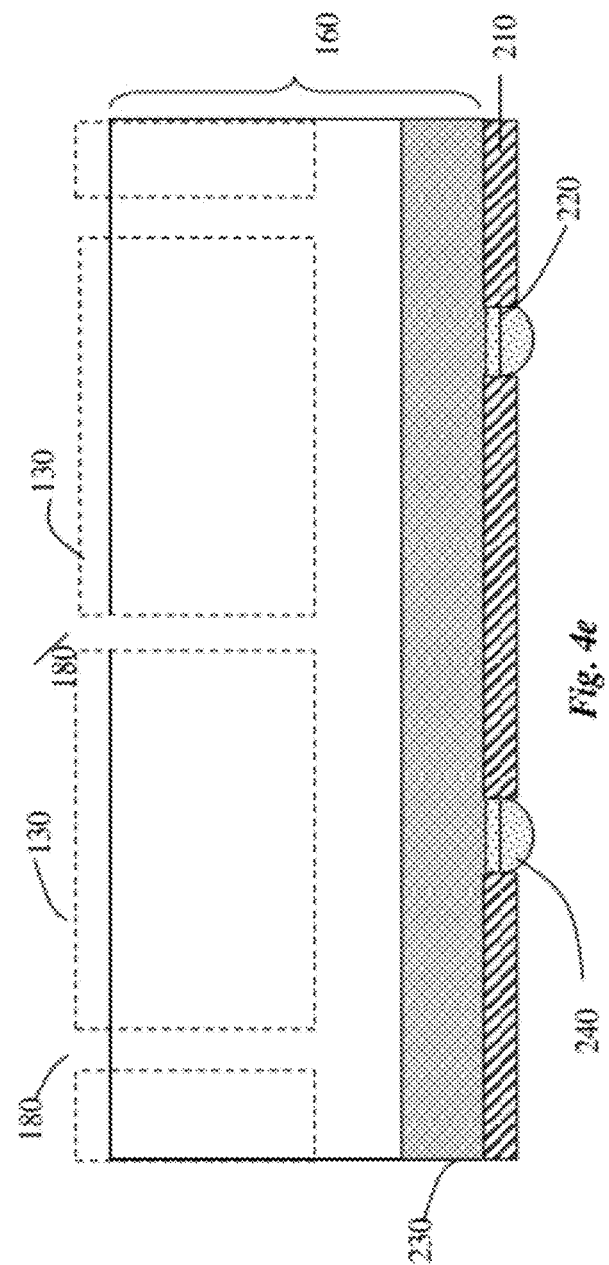

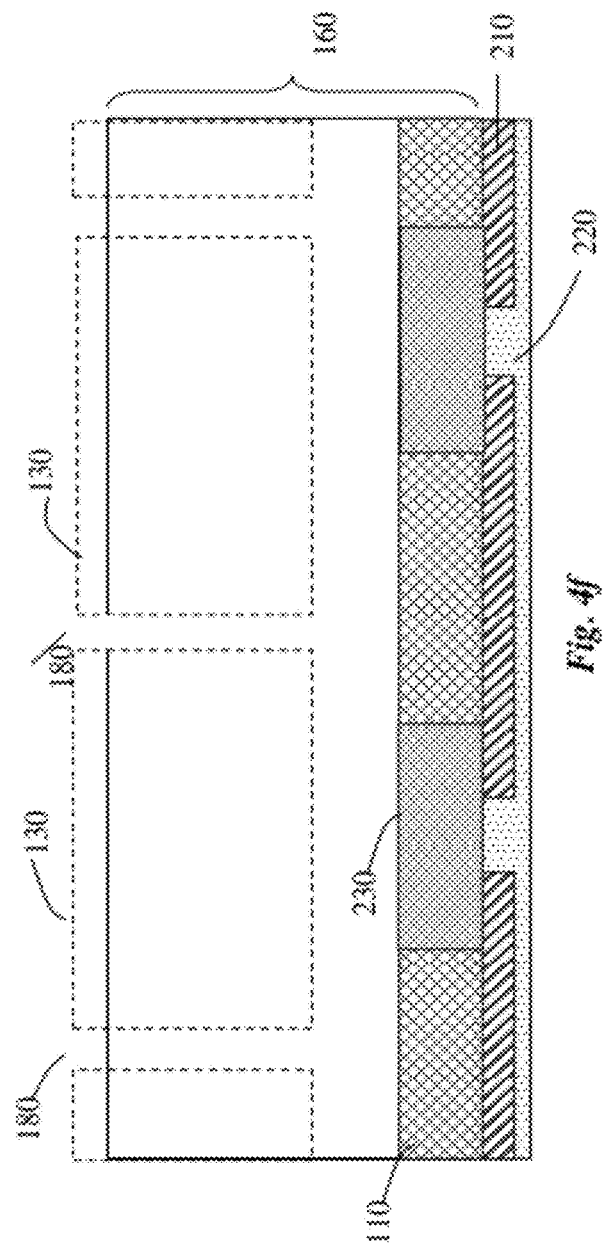

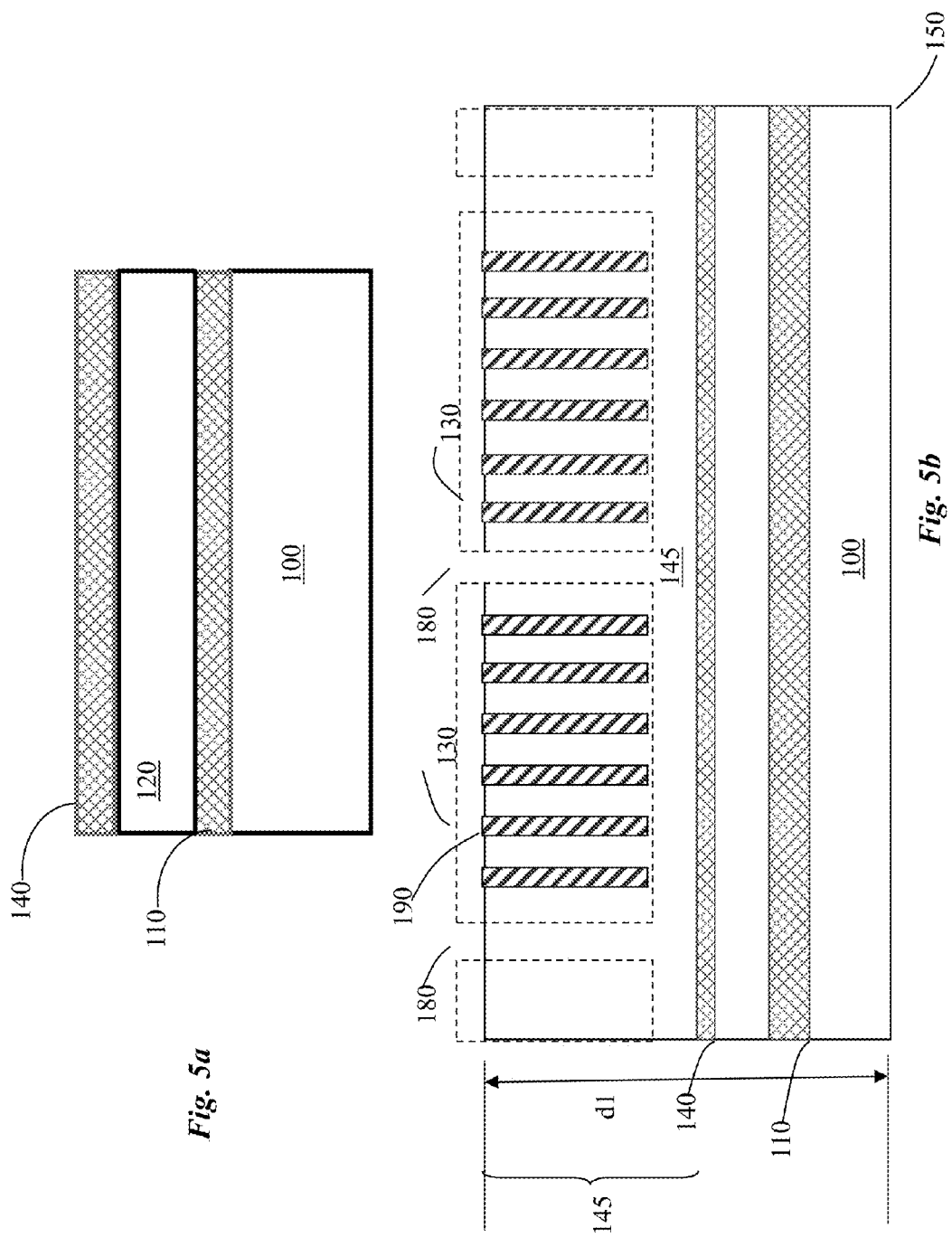

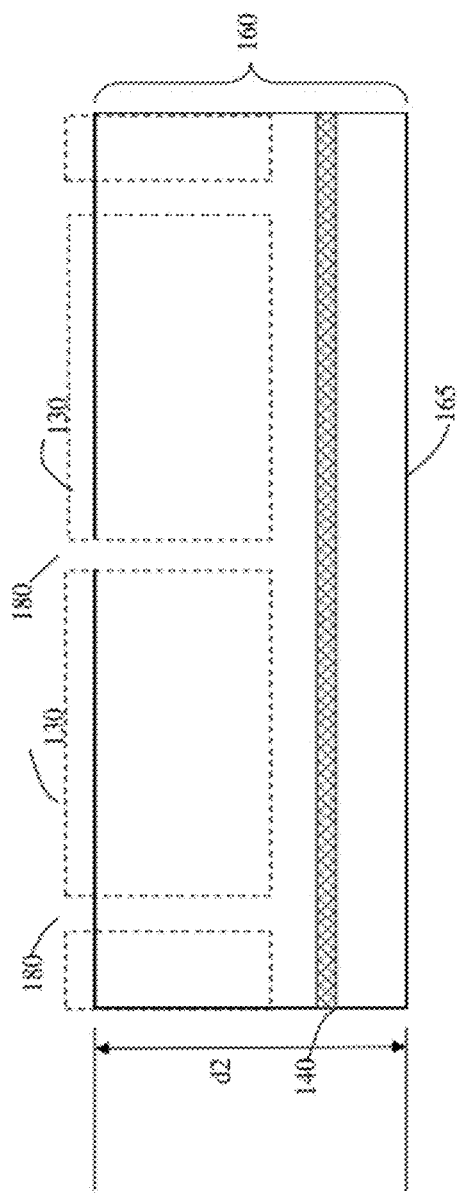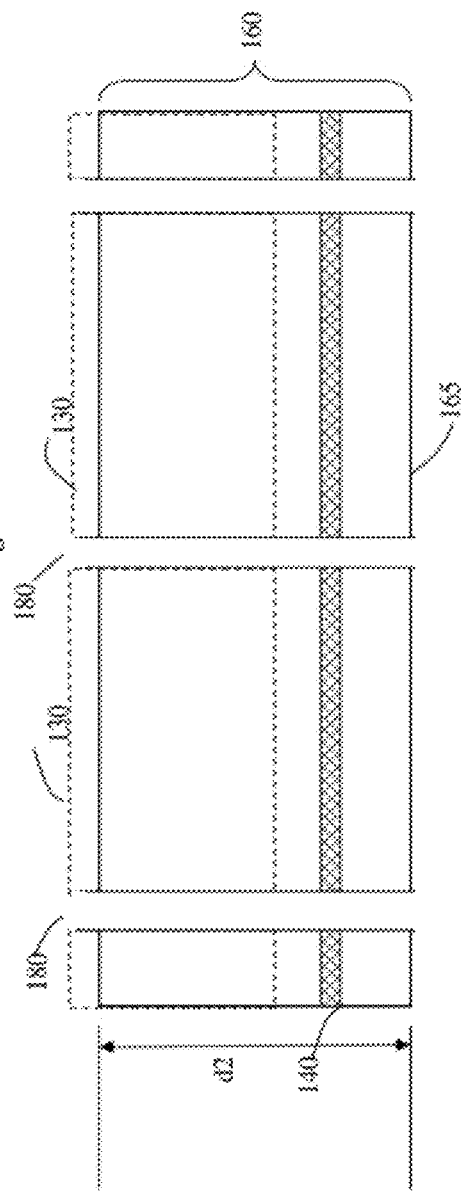

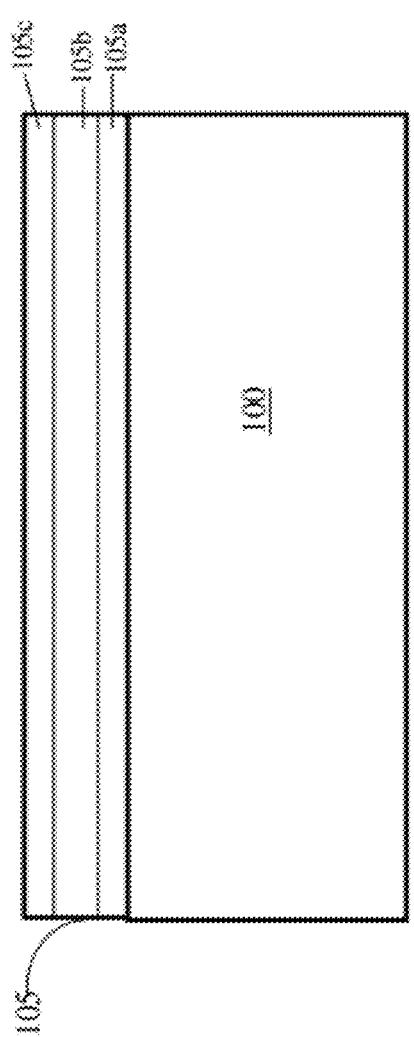
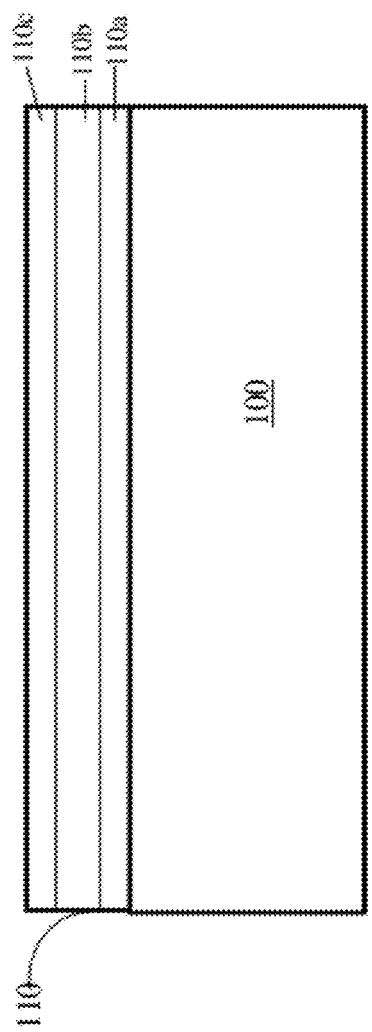

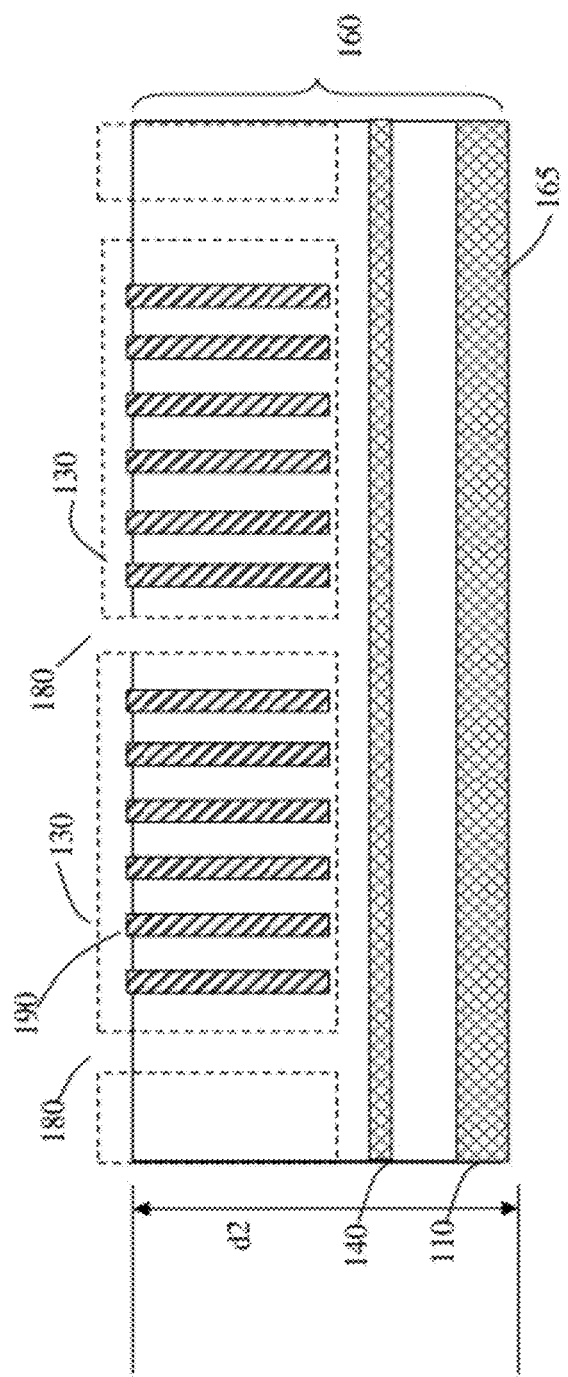

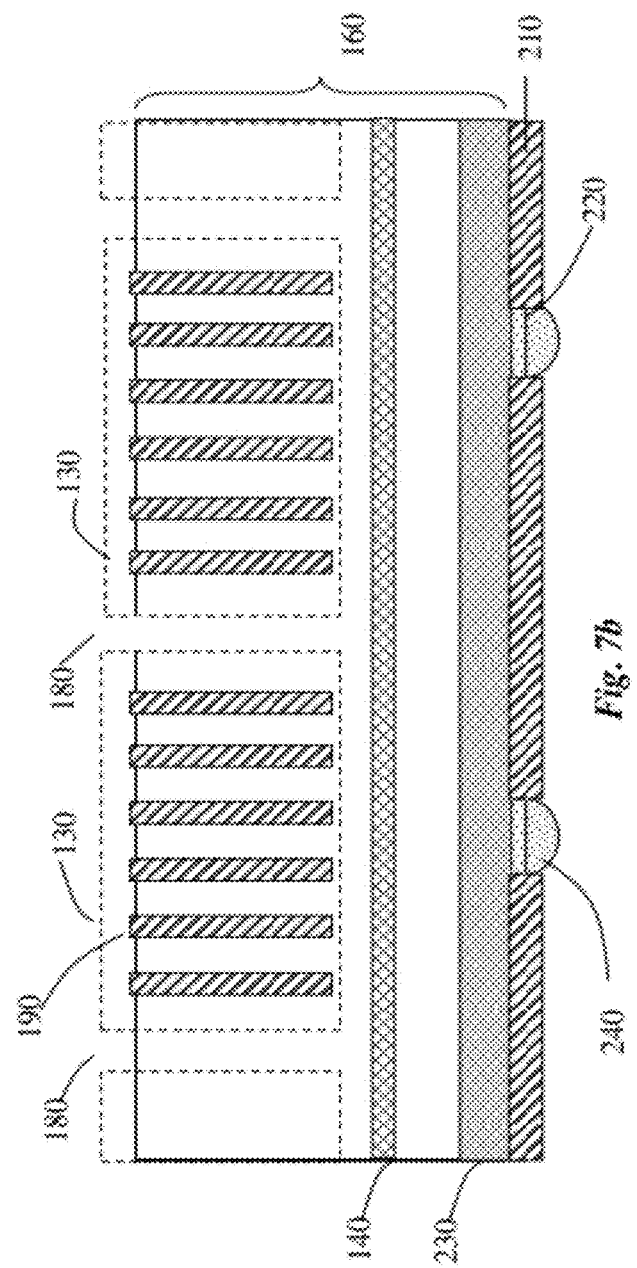

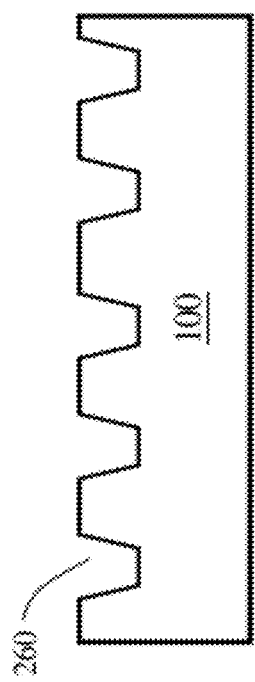
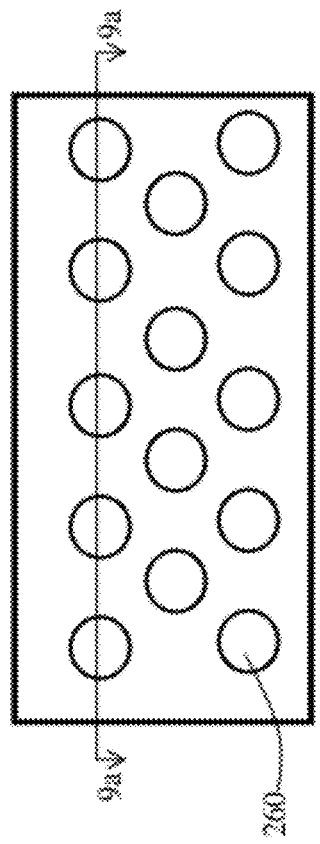
Fig. 9a
Fig. 9b

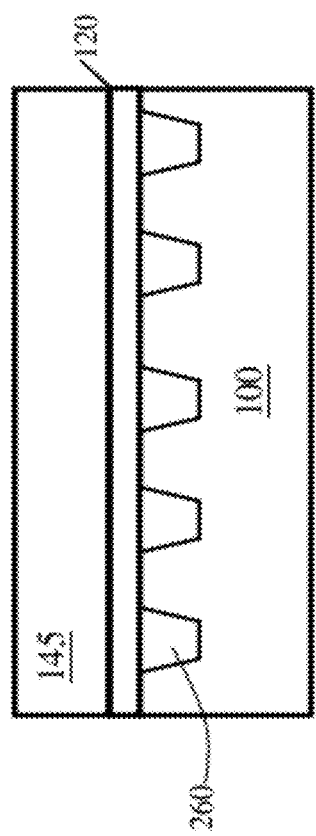

METHODS OF FORMING EPITAXIAL LAYERS ON A POROUS SEMICONDUCTOR LAYER

TECHNICAL FIELD

The present invention relates generally to semiconductors, and more particularly to semiconductor devices and methods of manufacturing thereof.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semi-conductive and insulating materials that are patterned and etched to form discrete devices or integrated circuits (ICs). There may be a plurality of transistors, memory devices, switches, conductive lines, diodes, capacitors, logic circuits, and other electronic components formed on a single die or chip, for example.

There is a trend in the semiconductor industry towards reducing the size of features, e.g., the circuits, elements, conductive lines, and vias of semiconductor devices, in order to increase performance of the semiconductor devices, for example. To continue this trend, innovative process solutions have been developed that overcome some of these limitations. For example, transistors are being built with increasing stress or strain. However, increasing stress results in many deleterious effects on other processes resulting in yield loss during fabrication or a reduction in product lifetime.

Hence, what are needed are method and devices that minimize stress related yield loss during semiconductor manufacturing and devices that are immune to stress induced failure.

SUMMARY OF THE INVENTION

These and other problems are generally solved or circumvented, and technical advantages are generally achieved, by illustrative embodiments of the present invention.

In accordance with an embodiment of the present invention, a method of forming a semiconductor device comprises forming a first porous semiconductor layer over a top surface of a substrate. A first epitaxial layer is formed over the first porous semiconductor layer. Circuitry is formed within and over the first epitaxial layer. The circuitry is formed without completely oxidizing the first epitaxial layer.

In another embodiment of the present invention, a method of forming a semiconductor device comprises forming a first porous semiconductor layer over a top surface of a substrate. A first epitaxial layer is formed over the first porous semiconductor layer. Circuitry is formed over the first epitaxial layer. Without removing the first porous semiconductor layer, the substrate is thinned from the back surface to form a thinned substrate.

In accordance with another embodiment, a method of forming a semiconductor device comprises forming a buffer semiconductor layer having pores or openings over a top surface of a substrate. The method further comprises forming a compound semiconductor layer over the buffer semiconductor layer.

In yet another embodiment, a semiconductor device comprises a first epitaxial layer disposed within a substrate. Circuitry is disposed within and over the first epitaxial layer. The circuitry is disposed adjacent to a top surface of the substrate. A first porous layer is disposed on a back surface of a substrate. The back surface is opposite to the top surface, and the first porous layer comprises a metal silicide.

In yet another embodiment, a semiconductor device comprises a buffer semiconductor layer having pores or openings disposed over a top surface of a substrate. The semiconductor device further comprises a compound semiconductor layer disposed over the buffer semiconductor layer.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 illustrates a semiconductor structure in a structural embodiment of the invention;

FIG. 2, which includes FIGS. 2a-2h, illustrates a method of manufacturing a semiconductor device in accordance with an embodiment of the invention;

FIG. 3, which includes FIGS. 3a-3c, illustrates another embodiment of the manufacturing process for fabricating the semiconductor device;

FIG. 4, which includes FIGS. 4a-4f, illustrates an alternative embodiment of the invention of manufacturing a semiconductor device;

FIG. 5, which includes FIGS. 5a-5d, illustrates another embodiment of the invention of manufacturing a semiconductor device;

FIG. 6, which includes FIGS. 6a and 6b, illustrates an embodiment of the invention for forming a multiple layers of porous semiconductor;

FIG. 7, which includes FIGS. 7a and 7b, illustrates an embodiment of manufacturing a semiconductor device;

FIG. 8, which includes FIG. 9, which includes FIGS. 9a-9c, illustrates an alternative embodiment for forming a semiconductor device.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 2D:
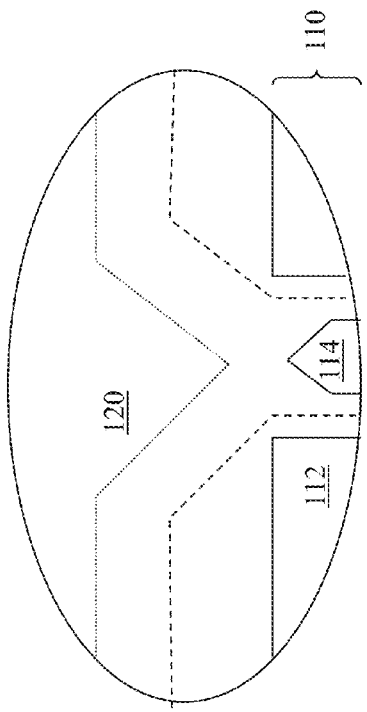

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In various embodiments, porous layers, such as porous semiconductor layers, are used to relieve stresses both during fabrication and post fabrication thereby improving fabrication yield and product lifetimes.

A structural embodiment of the invention will be described using FIG. 1. Next, methods of fabricating a device using various embodiments of the invention will be described using FIGS. 2-9.

FIG. 1 illustrates a semiconductor structure in a structural embodiment of the invention. The semiconductor structure 10 may be a portion of a wafer during manufacturing, or in some embodiments, a part of a singulated chip before packaging.

Referring to FIG. 1, the semiconductor structure 10 comprises a substrate 100. The substrate 100 may be a silicon substrate including a bulk mono-crystalline silicon substrate in one embodiment. The bulk mono-crystalline silicon substrate comprises a silicon surface with a (100) crystal orientation although in some embodiments it may comprise a (110) surface or a (111) surface. Alternatively, in other embodiments, the substrate 100 can be a silicon-on-insulator (SOI) wafer, or a germanium-on-insulator (GeOI) wafer. In other embodiments, other semiconductors such as silicon germanium, germanium, gallium arsenide, gallium nitride, indium arsenide, indium gallium arsenide, indium antimonide, silicon carbide, or others, and combinations thereof can be used.

A first porous semiconductor layer 110 is disposed on the top surface of the substrate 100. In one or more embodiments, the first porous semiconductor layer 110 is formed over the substrate 100 by deposition of another semiconductor film, which is then converted into the first porous semiconductor layer 110. In various embodiments, the first porous semiconductor layer 110 is epitaxially aligned with the substrate 100 and has the same crystal structure as the substrate 100. In one or more embodiments, the first porous semiconductor layer 110 and the substrate 100 comprise the same material. The thickness of the first porous semiconductor layer 110 may vary from about 0.2 µm to about 10 µm, and varies from 1 µm to 5 µm in one embodiment.

In various embodiments, the first porous semiconductor layer 110 comprises a plurality of pores of many shapes. The pores decrease the density (relative to substrate 100) while increasing the surface area to volume ratio. The number of pores, pore sizes and shapes may vary on many conditions including the doping of the substrate from which the first porous semiconductor layer 110 is formed, etching conditions used to form the pores etc.

For example, if the first porous semiconductor layer 110 comprises p-type silicon, the pore size and inter-pore spacing may be very small of the order of about 1 to about 5 nm, and the pore network may be very homogeneous and interconnected. In contrast, if the first porous semiconductor layer 110 comprises n-type silicon, the pores are much larger than similarly doped p-type doped porous semiconductor layer. However, heavily doped n-type porous silicon may have smaller pores than corresponding p-type porous silicon.

A first epitaxial layer 120 is disposed over the first porous semiconductor layer 110. The first epitaxial layer 120 is a silicon layer epitaxially aligned with the first porous semiconductor layer 110 and comprises the same crystal structure as the substrate 100. In various embodiments, the first epitaxial layer 120 may include active devices and/or passive devices.

In various embodiments, the first epitaxial layer 120 may comprise silicon. In alternative embodiments, the first epitaxial layer 120 comprises other semiconductors such as silicon germanium, germanium, gallium arsenide, gallium nitride, indium arsenide, indium gallium arsenide, indium antimonide, silicon carbide, or others, and combinations thereof.

The semiconductor structure 10 may be a final semiconductor device or a structure during fabrication of a semiconductor device in various embodiments.

FIG. 2, which includes FIGS. 2a-2h, illustrates a method of manufacturing a semiconductor device in accordance with an embodiment of the invention.

Referring to FIG. 2a, an optional epitaxial layer 105 is deposited over a substrate 100. As described above, the substrate 100 comprises a silicon substrate in one embodiment. In other embodiments, the substrate 100 may comprise other semiconductor materials. In various embodiments, the optional epitaxial layer 105 is deposited using any suitable deposition that produces epitaxy including molecular beam epitaxy as well as chemical vapor deposition. The optional epitaxial layer 105 may be doped suitably and may have a varying doping profile along the depth in some embodiments. The optional epitaxy layer 105 may comprise undoped regions in some embodiments.

Referring next to FIG. 2b, the optional epitaxial layer 105 is at least partially converted to a first porous semiconductor layer 110. In one or more embodiments, the first porous semiconductor layer 110 is formed using anodic electrochemical etching with hydro fluoric acid. In alternative embodiments, the first porous semiconductor layer 110 is formed by other types of etching.

In anodic electrochemical etching, the substrate 100 including the optional epitaxial layer 105 is placed within a HF solution. The substrate 100 is coupled to an anode and a cathode electrode is placed within the HF solution completing the circuit. The anodic potential moves holes from within the substrate 100 to the surface. At the surface, the holes weaken the silicon to silicon bonds, which are broken down by fluorine radicals. The HF concentration and current density may be adjusted to achieve desired pore formation. The global anodization reaction during pore formation proceeds as

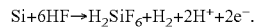

$$Si+6HF \rightarrow H_2SiF_6+H_2+2H^++2e^-.$$

Ethanol may be added to the HF solution to increase release of hydrogen from the surface. The properties of the first porous semiconductor layer 110, such as porosity, thickness, pore diameter and microstructure, depend on the anodization conditions. Therefore, HF concentration, current density, wafer type and resistivity, anodization duration, illumination, temperature, ambient humidity, drying conditions etc can be selected to achieve desired properties of the first porous semiconductor layer 110.

In alternative embodiments, as described further below with respect to FIG. 5, the porosity may be changed during the etch process to form a plurality of porous semiconductor layers.

The substrate 100 is removed from the HF solution and allowed to dry without cracking. Cracking arises from the large capillary stress resulting from evaporation of the HF solution from the pores. Therefore, drying processes must minimize these forces to avoid cracking and delamination of the first porous semiconductor layer 110 from the substrate 100. In various embodiments, the drying step may include pentane drying, supercritical drying, freeze drying and/or slow evaporation rates.

In one embodiment, pentane, which has a very low surface tension, is used because it has minimal chemical interaction with the first porous semiconductor layer 110. Therefore, capillary forces can be reduced dramatically when using pentane as the drying liquid. However, water and pentane are non-miscible liquids, and therefore isopropanol, ethanol or methanol may be used as intermediary liquids.

In supercritical drying, the direct phase transistion from liquid to gas is avoided by the use of solvent that is capable of being a supercritical fluid. Therefore, the liquid within the pores is first replaced with a solvent capable of being a supercritical fluid. The solvent is introduced in its liquid phase which therefore does not introduce any excessive capillary forces. The solvent is heated to the supercritical state and brought back to the gas state.

In one embodiment, the HF solution is replaced with carbon dioxide under high pressure. The workpiece including the substrate 100 is then moved above the critical point (e.g., 31 C) by raising the pressure and temperature. Then supercritical fluid is de-pressurized to the gas phase thereby removing it from within the pores.

Next, in some embodiments, the first porous semiconductor layer 110 may be oxidized after the drying step to protect the first porous semiconductor layer 110. A thin oxide layer, e.g., an oxide monolayer may be formed, which coats the skeleton of the first porous semiconductor layer 110.

Referring to FIG. 2c, a first epitaxial layer 120 is grown over the first porous semiconductor layer 110. In one or more embodiments, the first epitaxial layer 120 comprises silicon. In various embodiments, the first epitaxial layer 120 may comprises silicon, silicon carbide, silicon germanium as well as compound semiconductors such as GaAs, InP, InN, GaN, InSb etc. Compound semiconductors may be used for forming high performance devices (e.g., power transistors, bipolar transistors, high frequency transistors, high speed CMOS transistors, low power transistors etc.) as well as optoelectronic devices such as light emitting diodes, lasers etc.

In one or more embodiments, the first epitaxial layer 120 is aligned with the first porous semiconductor layer 110 and the substrate 100. In various embodiments, the first epitaxial layer 120 is deposited using any suitable deposition process that produces epitaxial growth including molecular beam epitaxy as well as chemical vapor deposition. The first epitaxial layer 120 may be doped suitably and may have a varying doping profile along the depth in some embodiments. In one embodiment, the first epitaxial layer 120 is lightly doped or undoped.

FIG. 2d illustrates a magnified cross section of the region 2d in FIG. 2c, and illustrates the interface between the first epitaxial layer 120 and the first porous semiconductor layer 110. The first porous semiconductor layer 110 comprises pores 114 separating silicon skeleton 112. Silicon naturally grows by faceting during the epitaxial process (shown by dashed and dotted lines in FIG. 2d) along the sidewalls and the top surface of the first porous semiconductor layer 110, and therefore adjacent facets eventually merge closing the pores 114. In the further course of epitaxial growth, leveling of the initial dip in the first epitaxial layer 120 may take place.

Figure 2E:
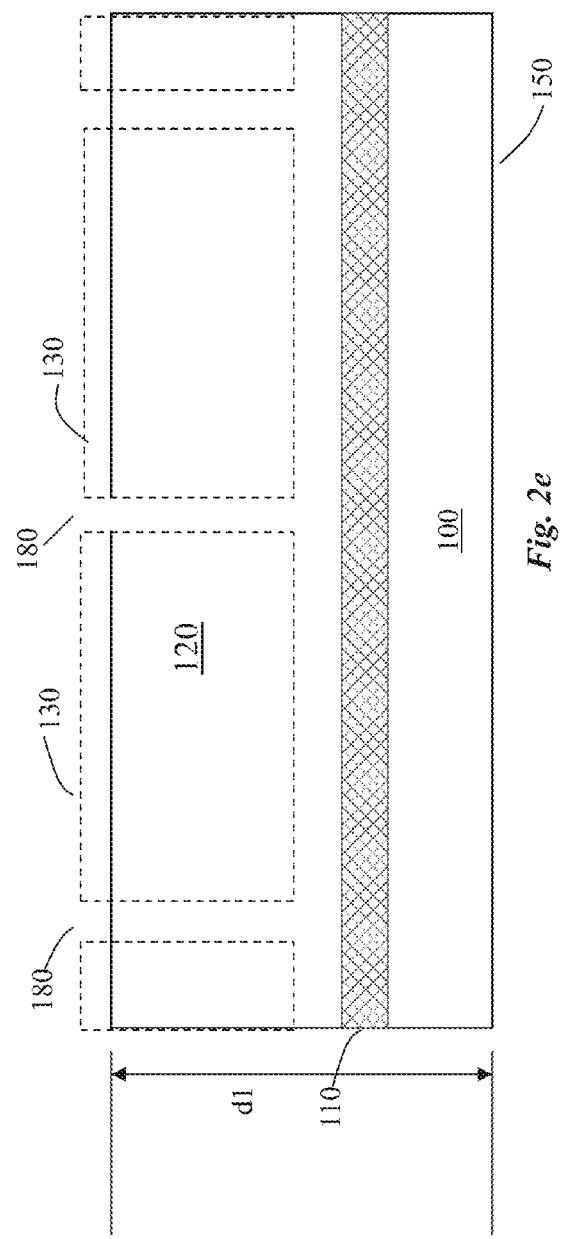

FIG. 2e illustrates the semiconductor device in the next stage of processing.

As illustrated in FIG. 2e, device regions are formed on the first epitaxial layer 120. The device regions, or active circuitry, can include transistors, diodes, resistors, capacitors, inductors or other components used to form integrated circuits.

Next, metallization is formed over the device regions to electrically contact and interconnect the device regions. The metallization and active circuitry together form a completed functional integrated circuit. In other words, the electrical functions of the chip can be performed by the interconnected active circuitry. The metallization in this context may include more than one metal level and/or conductive semiconductor layers and/or semiconductor-metal compounds like silicides.

After forming the top metallization, the substrate 100 comprises a back surface 150 and a first thickness d1. The substrate 100 includes chips 130 adjacent the top surface. The chips 130 are separated from each other by dicing streets also called sawing street or kerf. The dicing streets 180 represent the regions of the substrate 100 used to separate the substrate 100 into individual chips 130.

Figure 2F:
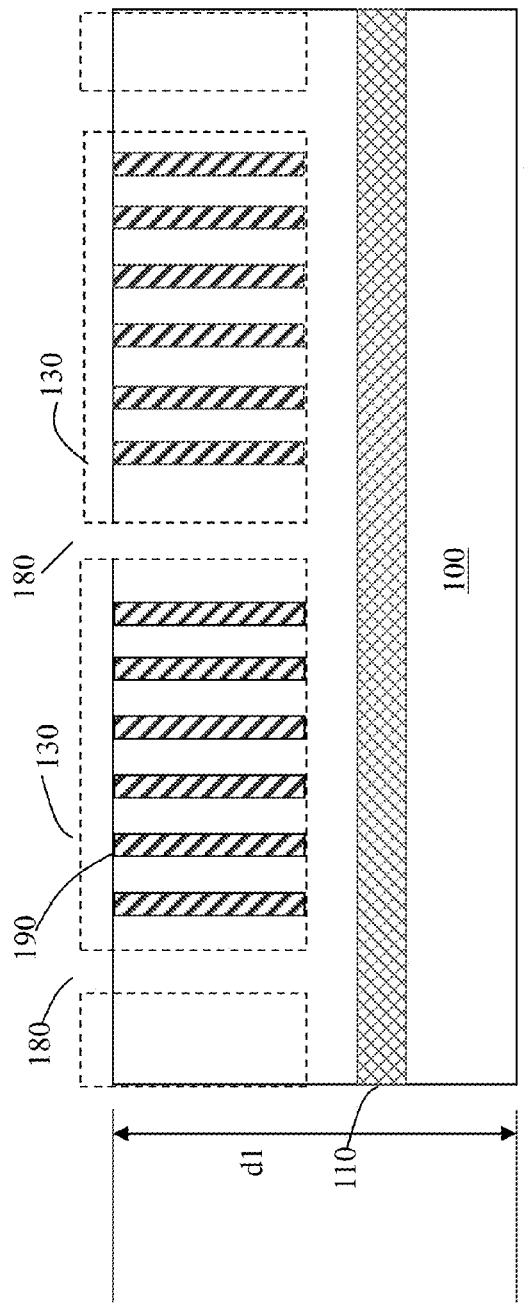

FIG. 2f illustrates an alternative embodiment in which the chips 130 may include stressor structures 190. In one embodiment, the stressor structures 190 may be deep trenches filled with a stress producing material, such as silicon oxide in one example. The stressor structures 190 are illustrated as a trench only as an illustration and may be any stress creating structure in various embodiments.

In alternative embodiments, the stressor structures 190 may include other sources of stresses including embedded silicon germanium layers, stress liners, and any other stressor structure introduced to modulate stress within the device regions.

Such stressor structure 190 may exert stress arising from lattice mismatch, thermal expansion mismatch during thermal anneal, and/or intrinsic film stress. Stressor structures 190 comprising SiGe source/drain regions is an example of strain from lattice mismatch. Stressor structures 190 including thermal mismatch may arise from film stress due to differences in thermal expansion coefficients, e.g., filling insulators into deep trenches for creating shallow trench isolation structures in integrated circuits. Thermal mismatch stresses are most dangerous (producing, e.g., defects and dislocations) during high temperature processing when the stress increases while the yield strength of silicon reduces. Such defects and dislocations can dramatically reduce manufacturing yield.

The large stressors generated by the stressor structures 190 may also result in wafer bowing in the absence of the first porous semiconductor layer 110. Wafer bow can result in yield loss due to e.g., lithography issues resulting in increased die to die variations and misalignment.

However, in various embodiments, advantageously, the first porous semiconductor layer 110 neutralizes the stress of the stressor structures 190 by absorbing the stress energy. Thus, during fabrication, bowing of the substrate 100 is minimized, as well as, defect and dislocation nucleation and subsequent propagation is mitigated using embodiments of the invention. For example, unlike crystalline materials that facilitate dislocation motion such as creep and climb mechanisms, porous silicon pins dislocation due to the displaced or missing atoms in the crystal lattice. Therefore, dislocations are unable to propagate through the porous silicon layer into the active regions.

Figure 2G:
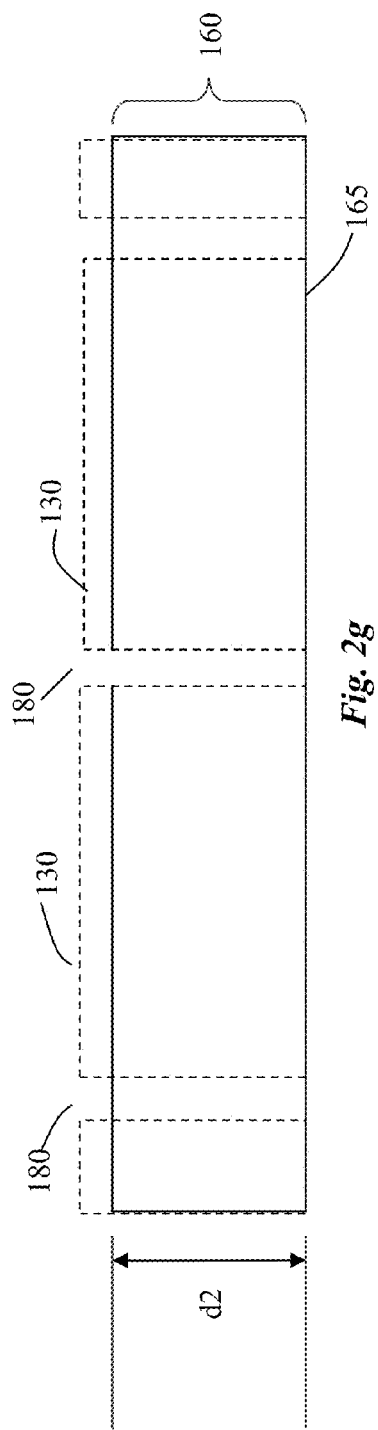

Referring next to FIG. 2g, the substrate 100 is thinned from the back surface 150 (illustrated in FIGS. 2e and 2f) to expose a new back surface 165 of a thinned substrate 160. In various embodiments, the thinning removes the first porous semiconductor layer 110 as illustrated in FIG. 2g.

The new back surface 165 may be passivated with an oxide layer and/or a nitride layer in some embodiments. In other embodiments, a metal layer or a stack of metal layers and/or metal alloys and/or other conductive layers may be deposited on the new back surface 165. In various embodiments, the thinned substrate 160 comprises a second thickness d2 of about 30 µm to about 500 µm. In one embodiment, the second thickness d2 is 100 µm to about 200 µm.

In one embodiment, the substrate 100 is thinned exposing a lower surface by grinding to the desired second thickness d2. In different embodiments, the thinning may be performed chemically and/or mechanically. For example, in one embodiment, a plasma etch may be used to thin the substrate 100 from the back side.

As next illustrated in FIG. 2h, the chips 130 may be separated along the dicing streets 180 exposing the sidewalls 170 of the chips 130. The separation may be performed by sawing in one embodiment. In alternative embodiments, other suitable means of separation like e. g. laser cutting, plasma etching or cleaving may be used.

FIG. 3, which includes FIGS. 3a-3c, illustrates another embodiment of the manufacturing process for fabricating the semiconductor device.

The process steps proceed similar to the previous embodiment following FIGS. 2a-2f. However, the thinning process is different in this embodiment. As illustrated in FIG. 3a, the thinning process does not remove the first porous semiconductor layer 110. Rather, the thinning process stops before reaching the bottom surface of the first porous semiconductor layer 110.

As illustrated in FIG. 3b, the chips 130 may include stressor structure 190. As illustrated in FIG. 3c, after dicing, the individual chips 130 include a portion of the first porous semiconductor layer 110.

Therefore, the first porous semiconductor layer 110 provides stress compensation even after chip fabrication. For example, this may alleviate stress related failure during packaging as well as other stress related failures (e.g., cracking or de-lamination of high stress concentration regions) during product use.

Figure 4B:
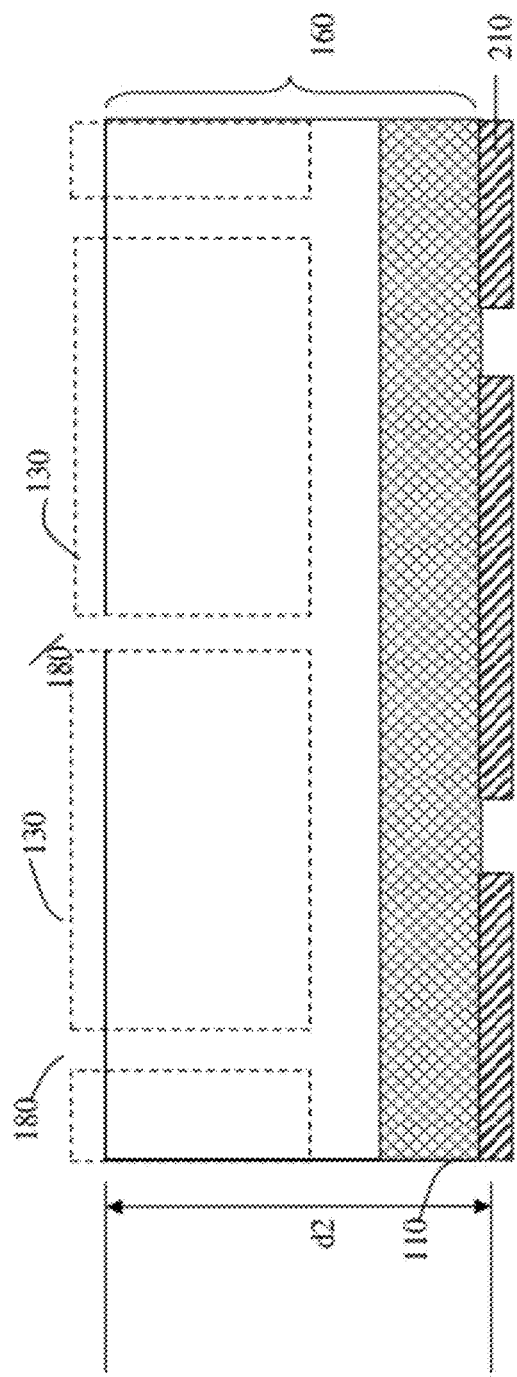

FIG. 4, which includes FIGS. 4a-4f, illustrates an alternative embodiment of the invention of manufacturing a semiconductor device.

The process steps proceed similar to the previous embodiment following FIGS. 2a-2f. However, the thinning process is different in this embodiment. As illustrated in FIG. 4a, the thinning process does not remove the first porous semiconductor layer 110 or leave at least a part of the first porous semiconductor layer 110. In various embodiments, the thinning process does not attack the first porous semiconductor layer 110. Rather, the thinning process stops after reaching the bottom surface of the first porous semiconductor layer 110. In one embodiment, the thinning process stops at the first porous semiconductor layer 110.

Next, a dielectric layer 210 is deposited and patterned as illustrated in FIG. 4b. An optional passivation layer may be deposited over the exposed surface of the first porous semiconductor layer 110. A further dielectric layer may be deposited and patterned forming patterned dielectric layer 210 using lithography (not shown).

The back side contacts are next formed within the openings of the patterned dielectric layer 210. The backside contact process may comprise any suitable contact chemistry and solder materials.

In one embodiment, a metal layer 220 is deposited over the patterned dielectric layer 210 as illustrated in FIG. 4c. In one or more embodiments, the metal layer 220 may comprise nickel, cobalt, titanium, tantalum, platinum, and/or silver. In various embodiments the metal layer 220 may comprise a metal that forms a silicide. The metal layer 220 may comprises a stack of sublayers having the same or different compositions. The metal layer 220 may be an alloy or a pure metal layer in various embodiments.

The metal is annealed or thermally activated so that it diffuses into the first porous semiconductor layer 110. Because of the fast diffusion of the metal atoms within the first porous semiconductor layer 110, the first porous semiconductor layer 110 is rapidly converted into the metal silicide. In various embodiments, the first porous semiconductor layer 110 may be partially (FIG. 4d) or fully silicided (FIG. 4c). Advantageously, the silicidation can be performed at very low temperatures than would be possible when siliciding bulk silicon. The first porous semiconductor layer 110 is thereby converted into a porous silicide layer 230.

Referring next to FIG. 4e, unreacted metal may be fully or partially removed by etching. Further contact layers may be formed as is known to one skilled in the art. In some embodiments, solder bumps 240 may be formed within the openings of the patterned dielectric 210 after the silicidation.

In an alternative embodiment, as illustrated in FIG. 4f, a portion of the first porous semiconductor layer 110 is silicided into the porous silicide layer 230.

In other alternative embodiments, the dielectric layer 210 is omitted so that the porous silicide layer 230 and/or metal layer 220 cover whole backside of the chip. Further, optional solder 240 bumps may, be formed.

Thus, a low resistance contact is formed on the back side of the substrate 100.

FIG. 5, which includes FIGS. 5a-5d, illustrates another embodiment of the invention of manufacturing a semiconductor device.

The process follows the prior embodiments with respect to FIGS. 2a-2c forming a first porous semiconductor layer 110 and a first epitaxial layer 120. However, as illustrated in FIGS. 5a-5b, the steps illustrated in FIGS. 2b and 2c are repeated thereby forming a second porous semiconductor layer 140 and a second epitaxial layer 145.

As illustrated in FIG. 5a, after forming the first epitaxial layer 120, a top portion of the first porous semiconductor layer 110 is electrochemically etched as described with respect to FIG. 2b forming a second porous semiconductor layer 120. However, in various embodiments, the process conditions chosen for forming the first porous semiconductor layer 110 is different from forming porous semiconductor layer 140. Therefore, the second porous semiconductor layer 140 may have different physical properties such as porosity, pore sizes, thickness etc relative to the first porous semiconductor layer 110. For example, in one embodiment, the first porous semiconductor layer 110 may be thicker than the second porous semiconductor layer 140 due to the existence of large stresses during fabrication than during product use. Similarly, in another embodiment, the first porous semiconductor layer 110 may comprise a larger porosity than the second porous semiconductor layer 140.

Referring to FIG. 5b, a second epitaxial layer 145 is deposited over the second porous semiconductor layer 140. Device regions and metallization layers of chips 130 are formed as described in earlier embodiments. Optionally, the device regions may include stressor structures 190 as described in prior embodiments.

As illustrated in FIG. 5c, the substrate 100 is thinned from the back side to reduce the thickness from a first thickness d1 (FIG. 5b) to a second thickness d2. As in the embodiment described with respect to FIG. 2, the thinning process removes the first porous semiconductor layer 110 exposing a new back surface 165 on the first epitaxial layer 120. Thereby, the thinning process does not remove the second porous semiconductor layer 140.

The chips 130 are separated as illustrated in FIG. 5d. Therefore, as in the embodiment described with respect to FIG. 3, each of the chips 130 comprises a portion of the second porous semiconductor layer 140.

FIG. 6, which includes FIGS. 6a and 6b, illustrates an embodiment of the invention for forming a multiple layers of porous semiconductors.

Referring to FIG. 6a, an optional epitaxial layer 105 is deposited as described with respect to FIG. 2. In various embodiments, the optional epitaxial layer 105 comprises a first region 105a having a first doping, a second region 105b having a second doping, and a third region 105c having a third doping.

In one embodiment, the first doping and the third doping are heavily doped regions and the second doping is lightly doped of the same conductivity. In one embodiment, the first and the third regions are heavily doped n-type regions while the second regions are lowly doped n-type regions. In another embodiment, the first and the third regions are heavily doped p-type regions while the second regions are lowly doped p-type regions.

Referring to FIG. 6b, the optional epitaxial layer 105 is converted to a first porous semiconductor layer 110. In one or more embodiments, the first porous semiconductor layer 110 is formed using anodic electrochemical etching with hydro fluoric acid.

Because of the change in doping, the porosity (and pore sizes) within the differently doped regions is different. In one embodiment, the heavily doped regions have, a larger porosity than the lightly doped region. Therefore, in one embodiment, the first and the third regions 105a and 105c, which are heavily doped, form a first and a third porous semiconductor layer 110a and 110c having a larger porosity than a second porous semiconductor layer 110b formed from a lightly doped second region 105b.

The plurality of porous semiconductor layers may be processed as shown in FIG. 5, wherein a lower porous semiconductor layer (first porous semiconductor layer 110a) may be removed during thinning leaving the third porous semiconductor layer 110c. For example, the removed first porous semiconductor layer 110a may be thicker or more porous and therefore may not be suitable to be used within the product. Thus, in various embodiments, the singulated chips 130 have a portion of the total thickness of the porous semiconductor used during fabrication.

Although the above was described using an optional epitaxial layer 105 comprising three doping regions, however, in other embodiments, a top region of the substrate may be used a third region while the optional epitaxial layer 105 may comprise only two doped regions. Therefore, the substrate doping, in such an alternative embodiment, may serve as first region 105a.

Advantageously, the embodiment described with respect to FIG. 6 may be implemented in the formation of the first porous semiconductor layer 110 of FIGS. 2-5, and the second porous semiconductor layer 140 of FIG. 5.

FIG. 7, which includes FIGS. 7a and 7b, illustrates an embodiment of manufacturing a semiconductor device.

This embodiment includes a first and a second porous semiconductor layers 110 and 140 as described with respect to the embodiment of FIG. 5. Further, as described with respect to the embodiment of FIG. 5, the thinning process does not remove the second porous semiconductor layer 140. As described with respect to the embodiment of FIG. 4, the first porous semiconductor layer 110 is partially or fully converted to a metal silicide (porous silicide 230) by depositing a metal layer 220 over the first porous semiconductor layer 110 and diffusing the metals from the metal layer 220 into the exposed first porous semiconductor layer 110 (FIG. 7b). Contacts are subsequently formed forming, for example, solder bumps 240.

As described in various embodiments, the porous layers may not necessarily have a three-layer structure and may comprise more or less number of layer in various embodiments. For growing an epitaxial layer on top of a porous layer it is advantageous to have small pore sizes for the porous layer, for example, below 10 nm. Having a porous layer with small pore size reduces the risk of creating crystal dislocations or stacking faults in the epitaxial layer.

Figure 8A:
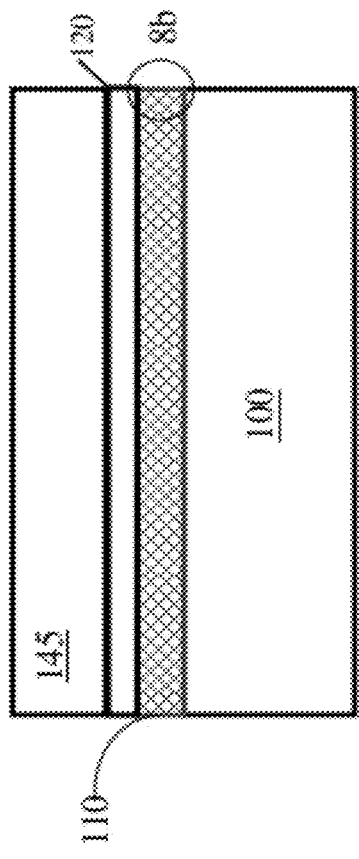
FIGS. 8a-8c, illustrates a method of fabrication of a semiconductor device in accordance with another embodiment of the invention.
Figure 8B:
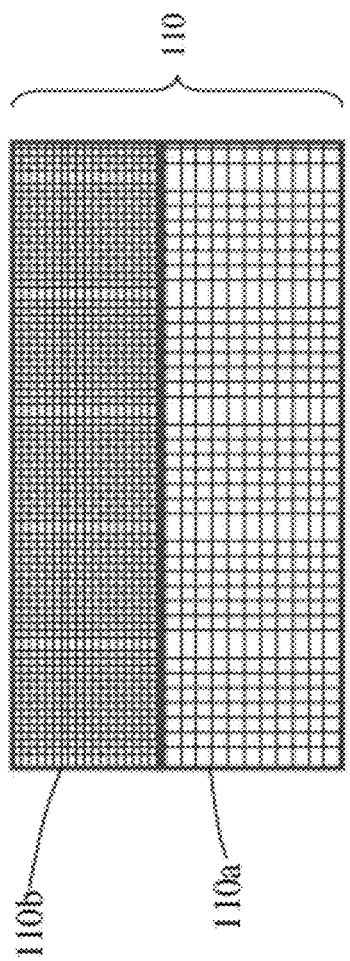
Figure 8C:
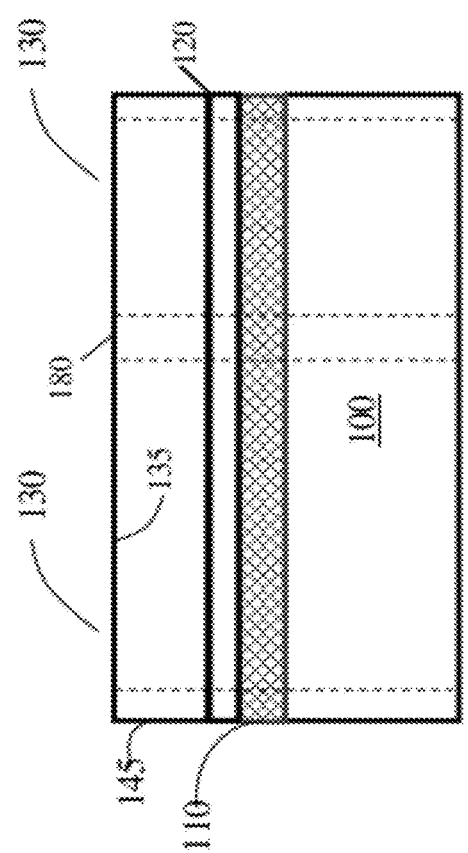

FIG. 8, which includes FIGS. 8a-8c, illustrates a method of fabrication of a semiconductor device in accordance with another embodiment of the invention. FIGS. 8a and 8c illustrate cross sectional view of the semiconductor device, whereas FIG. 8b illustrates a magnified cross sectional view of a porous semiconductor layer.

This embodiment proceeds as described in prior embodiments with the growth of a first porous semiconductor layer 110 over a substrate 100. The first porous semiconductor layer 110 may be about 0.2 µm to about 10 µm, and varies from 1 µm to 5 µm in one embodiment.

As illustrated in FIG. 8b, which is a magnified view of reference 8b in FIG. 8a, in one embodiment, the first porous semiconductor layer 110 comprises two sublayers of porous semiconductor layers: a lower sublayer 110a comprising a larger pore size and a upper sublayer 110b comprising a smaller pore size. In one embodiment, the lower sublayer 110a comprises a pore size greater than 50 nm, and the upper sublayer 110b comprises a size between about 2 nm to about 50 nm. In one embodiment, the lower and the upper sublayers 110a and 110b are formed by exposing the first porous semiconductor layer 110 to a hydrogen anneal. The hydrogen anneal increases the mobility of silicon atoms locally. Therefore, the silicon atoms from the deeper portions of the first porous semiconductor layer 110 move and form a upper sublayer 110b having a smaller pore size leaving behind a lower sublayer 110a having a large pore size.

The first epitaxial layer 120 is epitaxially grown over the first porous semiconductor layer 110. The first epitaxial layer 120 is grown at low temperatures, less than about 700° C. in one embodiment. The first epitaxial layer 120 may be grown using dichlorosilane ($SiH_2Cl_2$), trichlorosilane ($SiHCl_3$), silane ($SiH_4$), disilane ($Si_2H_6$), trisilane ($Si_3H_8$), or combinations thereof. In an alternative embodiment, the first epitaxial layer 120 may be formed directly without an epitaxial process by exposing the first porous semiconductor layer 110 to a hydrogen anneal. Therefore, the silicon atoms from the deeper portions of the first porous semiconductor layer 110 move and form a pore free layer.

In one or more embodiments, the substrate 100, the first porous semiconductor layer 110, and the first epitaxial layer 120 all comprise the same material.

In one embodiment, the substrate 100, the first porous semiconductor layer 110, and the first epitaxial layer 120 are silicon. The first epitaxial layer 120 therefore comprises a same crystal structure as the substrate 100.

A second epitaxial layer 145 is epitaxially grown over the first epitaxial layer 120. In various embodiments, the second epitaxial layer 145 comprises a different material than the first epitaxial layer 120. In various embodiments, the second epitaxial layer 145 comprises a compound semiconductor such as an III-V semiconductor, or an II-VI semiconductor, and the substrate 100 comprises a silicon wafer.

Therefore, the equilibrium lattice spacing of the second epitaxial layer 145 and the equilibrium lattice spacing of the first epitaxial layer 120 are different. The equilibrium lattice spacing is the lattice spacing of a bulk crystal at thermal equilibrium, for example, at room temperature, without strain. The first epitaxial layer 120 and the second epitaxial layer 145 may not have a same equilibrium crystal structure. However, the second epitaxial layer 145 may still grow out of the first epitaxial layer 120 provided the crystal planes are compatible. For example, in one embodiment, a (1000) or a (11$\bar{2}$1) surface of GaN may grow from a (100) silicon surface even though GaN and Si have different crystal structures. In another embodiment, a (11$\bar{2}$0) surface of GaN may be grown from a (110) or a ($\bar{1}$10) silicon surface. Alternatively, a (0001) surface of GaN may be grown from a (111) silicon surface.

For example, the lattice mismatch between (111) Si and (0001) GaN is about 17%, and the thermal coefficient of expansion mismatch is about $2\times10^{-6}$ K$^{-1}$ resulting in large stress between a Si and a GaN layer. Therefore, embodiments of the invention use a low temperature growth process for growing the second epitaxial layer 145 if the thermal mismatch between the first epitaxial layer 120 and the second epitaxial layer 145 is significant. Further, the second epitaxial layer 145 may be doped with the material of the first epitaxial layer 120. In particular, in some embodiments, a graded second epitaxial layer 145 may be used wherein the doping of the material of the first epitaxial layer 120 may be gradually reduced. For example, the silicon doping in the GaN may be gradually reduced over a 0.5 μm to a 1 μm thickness away from the interface from the silicon and the GaN layers.

Advantageously, the first porous silicon layer 110 absorbs the strain energy and prevents dislocation from nucleating and propagating into the second epitaxial layer 145. As a consequence, thick layers of second epitaxial layer 145 may be grown without significant defect nucleation. For example, dislocation density may be lower than $10^5$ cm$^{-2}$, and the thickness of the second epitaxial layer 145 may be larger than about 5 μm for a 5 inch (diameter) substrate 100.

As illustrated in FIG. 8c, device regions 135 may be formed within and adjacent the top surface of the second epitaxial layer 145. Because the first porous semiconductor layer 110 relaxes the stress within the second epitaxial layer 145 and between the first and the second epitaxial layers 120 and 145, high temperature processing required for forming device regions 135 may be performed without further defect nucleation or propagation.

After forming metallization layers and contacts, individual chips 130 are separated along dicing streets 180. In this embodiment, the first porous semiconductor layer 110 is not removed to avoid damaging the second epitaxial layer 145 during product life time.

FIG. 9, which includes FIGS. 9a-9c, illustrates an alternative embodiment for forming a semiconductor device.

FIGS. 9a and 9b illustrate the semiconductor after formation of openings in the substrate 100. FIG. 9a illustrates a cross sectional view whereas FIG. 9b illustrates a top view.

Referring to FIG. 9a, openings are formed in the substrate 100. Using, for example, lithography techniques, patterns for openings are formed. Openings 260 are subsequently formed within the substrate 100 using an anisotropic etch process such as reactive ion etching. The openings 260 may be cylindrical (hole like as illustrated in FIG. 9b) or rectangular (trench like) in various embodiments.

In various embodiments, the depth of the openings 260 is about 0.2 μm to about 10 μm, and varies from 1 μm to 5 μm in one embodiment. The areal density of the openings 260 (area of the surface of the substrate 100 occupied by the openings 260 divided by the total area of the surface of the substrate 100) is about 30% to about 70%, and about 50% in one embodiment. The openings 260 are about 10 nm to about 200 nm in width in various embodiments.

Advantageously, in this embodiment, the openings 260, which are equivalent to the pores in a porous layer, are distributed in a determinative pattern. In various embodiments, the pattern of the openings 260 is determined by a mask, and therefore may be optimized to achieve a specific depth, width, and areal density of the openings 260.

As next illustrated in FIG. 9c, a first epitaxial layer 120 may be formed as described in prior embodiments, for example, as described with respect to FIG. 2 or FIG. 8. A second epitaxial layer 145 may be formed over the first epitaxial layer 120 as described with respect to FIG. 8.

In some embodiments, the first epitaxial layer 120 may be skipped, and the second epitaxial layer 145 may be formed directly on the substrate 100.

Subsequent processing as described in prior embodiments. For example, as described with respect to FIG. 8, the substrate 100 and the first porous epitaxial layer 110 is retained in the final chip to minimize defect nucleation during product use.

Embodiments of the invention include forming backside metallization, which is common for power devices (discrete devices, power-ICs) and some special devices (e. g. RF-devices). Backside metallization as described in various embodiments here may also be used for devices using through-silicon vias bringing the contact area to the opposite chip area, away from the active semiconductor layer.

However, embodiments of the invention also include devices wherein the backside is protected or do not have any backside layers. For example, MEMS devices could have a backside passivation layer but no backside metallization layers. However, most integrated circuits such as logic devices, microcontrollers, memory devices, and chip card devices usually may not have any backside metallization and backside passivation at all.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a first porous semiconductor layer over a top surface of a substrate;
   forming a first epitaxial layer over the first porous semiconductor layer, wherein forming the first porous semiconductor layer comprises depositing an epitaxial layer and electrochemically etching at least a portion of the epitaxial layer, wherein depositing the epitaxial layer comprises forming a first layer having a first doping, and a second layer having a second doping different from the first layer;

forming stressor structures in the first epitaxial layer;

forming circuitry within and over the first epitaxial layer, wherein the circuitry is formed without completely oxidizing the first epitaxial layer;

forming a second porous semiconductor layer between the top surface of the substrate and the first porous semiconductor layer;

forming a second epitaxial layer between the first porous semiconductor layer and the second porous semiconductor layer;

thinning the substrate from a back surface to form an intermediate structure; and dicing the intermediate structure to form singulated chips, wherein the thinning removes the second porous semiconductor layer, and wherein the thinning is stopped before reaching the first porous semiconductor layer.

2. The method of claim 1, wherein the substrate is a silicon wafer.

3. A method of forming a semiconductor device, the method comprising:

forming a first porous semiconductor layer over a top surface of a substrate;

forming a first epitaxial layer over the first porous semiconductor layer;

forming stressor structures in the first epitaxial layer; and forming circuitry within and over the first epitaxial layer, wherein the circuitry is formed without completely oxidizing the first epitaxial layer;

forming a second porous semiconductor layer between the top surface of the substrate and the first porous semiconductor layer;

forming a second epitaxial layer between the first porous semiconductor layer and the second porous semiconductor layer;

thinning the substrate from a back surface to form a remaining structure; and dicing the remaining structure to form singulated chips, wherein the thinning removes the second porous semiconductor layer, and wherein the thinning is stopped before reaching the first porous semiconductor layer.

4. The method of claim 1, wherein the substrate comprises a silicon wafer.

5. The method of claim 3, wherein forming the first epitaxial layer comprises:

growing the first epitaxial layer along sidewalls and a top surface of the first porous semiconductor layer to form facets, and merging the facets to close the pores in the first porous semiconductor layer.

6. The method of claim 3, wherein the substrate is a silicon wafer.

7. The method of claim 3, wherein forming the first porous semiconductor layer comprises:

depositing an additional epitaxial layer; and electrochemically etching the additional epitaxial layer.

8. The method of claim 3, wherein forming the first porous semiconductor layer comprises depositing an additional epitaxial layer and electrochemically etching the additional epitaxial layer, and wherein depositing the additional epitaxial layer comprises forming a first layer having a first doping, and a second layer having a second doping different from the first layer.

9. The method of claim 5, wherein forming the second porous semiconductor layer comprises:

depositing an additional epitaxial layer; and electrochemically etching the additional epitaxial layer.

10. The method of claim 3, wherein forming the first epitaxial layer comprises:

growing the first epitaxial layer along sidewalls and a top surface of the first porous semiconductor layer to form facets, and merging the facets to close the pores in the first porous semiconductor layer;

wherein forming the second porous semiconductor layer comprises depositing a third epitaxial layer and electrochemically etching the third epitaxial layer, and wherein depositing the third epitaxial layer comprises forming a first layer having a first doping, and a second layer having a second doping different from the first layer.

11. A method of forming a semiconductor device, the method comprising:

forming a buffer semiconductor layer having pores or openings over a top surface of a substrate, wherein forming the buffer semiconductor layer comprises etching using an anodic electrochemical etch process to form a porous region and exposing the porous region to a hydrogen anneal;

forming a compound semiconductor layer over the buffer semiconductor layer, wherein forming the compound semiconductor layer comprises:

growing the compound semiconductor layer along sidewalls and a top surface of the buffer semiconductor layer to form facets, and merging the facets to close the pores in the buffer semiconductor layer;

forming circuitry within and over the compound semiconductor layer, wherein the circuitry is formed without completely oxidizing the compound semiconductor layer;

forming a porous semiconductor layer between the top surface of the substrate and the buffer semiconductor layer;

forming an epitaxial semiconductor layer between the buffer semiconductor layer and the porous semiconductor layer;

thinning the substrate from a back surface to form an remaining structure; and dicing the remaining structure to form singulated chips, wherein the thinning removes the porous semiconductor layer, and wherein the thinning is stopped before reaching the buffer semiconductor layer.

12. The method of claim 11, wherein the circuitry comprises an optoelectronic device.

13. The method of claim 11, wherein the circuitry comprises a transistor.

14. The method of claim 11, wherein the substrate comprises a silicon wafer, and wherein the compound semiconductor layer comprises GaN.

* * * * *